(12) United States Patent
Shin et al.

(10) Patent No.: US 7,608,519 B2
(45) Date of Patent: Oct. 27, 2009

(54) METHOD OF FABRICATING TRENCH ISOLATION OF SEMICONDUCTOR DEVICE

(75) Inventors: Dong-suk Shin, Yongin-Si (KR); Yong-kuk Jeong, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 532 days.

(21) Appl. No.: 11/498,667

(22) Filed: Aug. 3, 2006

(65) Prior Publication Data

US 2007/0037348 A1     Feb. 15, 2007

(30) Foreign Application Priority Data

Aug. 9, 2005   (KR) .................. 10-2005-0072792

(51) Int. Cl.
    *H01L 21/76* (2006.01)
(52) U.S. Cl. .............. 438/437; 438/435; 438/436; 438/424; 257/E21.54
(58) Field of Classification Search ................ 438/424, 438/435, 436, 437
    See application file for complete search history.

(56) References Cited

U.S. PATENT DOCUMENTS

| | | | |
|---|---|---|---|
| 6,368,941 B1 * | 4/2002 | Chen et al. | 438/424 |
| 6,479,369 B1 | 11/2002 | Miyoshi | |
| 7,118,987 B2 * | 10/2006 | Fu et al. | 438/435 |
| 7,268,057 B2 * | 9/2007 | Ryan et al. | 438/427 |
| 2004/0058549 A1 | 3/2004 | Ho et al. | |
| 2004/0245091 A1 * | 12/2004 | Karim et al. | 204/192.12 |
| 2005/0074946 A1 | 4/2005 | Chu et al. | |
| 2005/0118784 A1 | 6/2005 | Kim | |
| 2005/0153519 A1 | 7/2005 | Lu et al. | |

FOREIGN PATENT DOCUMENTS

| | | |
|---|---|---|
| CN | 1490866 A | 4/2004 |
| JP | 11-233614 | 8/1999 |
| JP | 2001-135718 | 5/2001 |
| KR | 10-2001-0058965 | 7/2001 |
| KR | 2001-0055874 | 7/2001 |
| KR | 10-2004-0049888 | 6/2004 |
| KR | 10-2005-0012648 | 2/2005 |
| KR | 10-2005-0073105 | 7/2005 |

OTHER PUBLICATIONS

Chinese Office Action dated Apr. 3, 2009, issued in corresponding Chinese Application No. 200610151568.9 and English translation.

* cited by examiner

*Primary Examiner*—Zandra Smith
*Assistant Examiner*—Christy L Novacek
(74) *Attorney, Agent, or Firm*—Mills & Onello LLP

(57) ABSTRACT

In a method of fabricating a trench isolation structure of a semiconductor device, excellent gap filling properties are attained, without the generation of defects. In one aspect, the method comprises: loading a substrate with a trench formed therein into a high-density plasma (HDP) chemical vapor deposition apparatus; primarily heating the substrate; applying a first bias power to the apparatus so as to form an HDP oxide liner on side wall and bottom surfaces of the trench, a gap remaining in the trench following formation of the HDP oxide liner; removing the application of the first bias power and secondarily heating the substrate; applying a second bias power at a power level that is greater than that of the first bias power to the substrate so as to form an HDP oxide film to fill the gap in the trench; and unloading the substrate from the apparatus.

29 Claims, 7 Drawing Sheets

METHOD OF FABRICATING TRENCH ISOLATION OF SEMICONDUCTOR DEVICE

This application claims priority to Korean Patent Application No. 10-2005-0072792 filed on Aug. 9, 2005 in the Korean Intellectual Property Office, the disclosure of which is incorporated herein by reference in its entirety.

BACKGROUND OF THE INVENTION

1. Field of the Invention

The present invention relates to a method of fabricating a semiconductor device, and more particularly, to a method of fabricating a trench isolation structure by using a high-density plasma chemical vapor deposition apparatus.

2. Description of the Related Art

As a type of technology for providing device isolation in highly-integrated semiconductor devices, a shallow trench isolation (hereinafter, referred to as 'STI') fabricating method has been widely applied. In the STI process, in order to prevent the occurrence of defects and to make device characteristics stable, an oxide film liner and a nitride film liner are sequentially formed on the side walls and bottom surface of an STI trench, and then the trench is filled with a high-density plasma (hereinafter, simply referred to as 'HDP') oxide film, thereby forming the STI structure.

However, with continued pressure for higher integration, as the design rule of a semiconductor device decreases, the aspect ratio of the STI structure increases, and the width of the gap of the STI trench decreases. Accordingly, the ability to fill the gap inside the STI trench without producing voids has increased in importance.

In order to ensure an excellent gap filling property, a method of increasing a bias power in the HDP process can be used. However, when the bias power is increased, the oxide film 12 and the liner 13 of the side walls and bottom of the STI trench are more likely to become separated from the surface of the substrate 10, as shown in the TEM (Transmission Electron Microscopy) photograph of FIG. 1. Further, as shown in the SEM (Scanning Electron Microscopy) photograph of FIG. 2, multiple bubble defects 16 may occur in the HDP oxide film 14.

In order to prevent the above-described separation phenomenon and bubble defects, there has been suggested a method in which a medium-temperature oxide liner is additionally formed on the nitride liner. However, in this case, the gap is further decreased due to the additional medium-temperature oxide liner having a thickness of about 50 to 300 Å, which causes a drastic decrease in the gap filling margin. Further, an additional chemical vapor deposition (hereinafter, simply referred to as 'CVD') process is required, which can complicate and lengthen device fabrication time.

SUMMARY OF THE INVENTION

Embodiments of the present invention are directed to a method of fabricating a trench isolation structure of a semiconductor device in a manner which alleviates the limitations associated with the conventional approaches described above.

In one aspect, the present invention is directed to a method of fabricating a trench isolation structure of a semiconductor device, comprising: loading a substrate with a trench formed therein into a high-density plasma (HDP) chemical vapor deposition apparatus; primarily heating the substrate; applying a first bias power to the apparatus so as to form an HDP oxide liner on side wall and bottom surfaces of the trench, a gap remaining in the trench following formation of the HDP oxide liner; removing the application of the first bias power and secondarily heating the substrate; applying a second bias power at a power level that is greater than that of the first bias power to the substrate so as to form an HDP oxide film to fill the gap in the trench; and unloading the substrate from the apparatus.

In one embodiment, the primarily heating, the substrate is heated to a temperature in a range of about 300 to 400° C.

In another embodiment, in the forming of the HDP oxide liner, the substrate is heated to a temperature in a range of about 300 to 450° C.

In another embodiment, the first bias power is in a range of about 500 to 2000 W.

In another embodiment, the forming of the HDP oxide liner is performed within a time period which corresponds to a range of about 1/200 to 1/10 amount of a time period for forming of the HDP oxide film.

In another embodiment, the forming of the HDP oxide liner is performed for a time period ranging from about one to five seconds.

In another embodiment, in the forming of the HDP oxide liner, a He gas is used as a sputtering gas.

In another embodiment, in the secondarily heating, the substrate is heated to temperature in a range of about 400 to 600° C.

In another embodiment, the secondarily heating is performed for a time period ranging from about 50 to 150 seconds.

In another embodiment, in the forming of the HDP oxide film, the substrate is at a temperature ranging from about 600 to 800° C.

In another embodiment, the second bias power is in a range of about 3000 to 6000 W.

In another embodiment, the forming of the HDP oxide film is performed for time period ranging from about 50 to 200 seconds.

In another embodiment, in the forming of the HDP oxide film, a $H_2$ gas is used as a sputtering gas.

In another embodiment, an oxide film and a nitride liner are sequentially formed on the side wall and bottom surfaces of the trench.

In another aspect, the present invention is directed to a method of fabricating a trench isolation structure of a semiconductor device, comprising: loading a substrate with a trench formed therein into a high-density plasma (HDP) chemical vapor deposition apparatus; primarily heating the substrate; forming a He HDP oxide liner on side wall and bottom surfaces of the trench, a gap remaining in the trench following forming the He HDP oxide liner; secondarily heating the substrate; forming a $H_2$ HDP oxide film to fill the gap in the trench; and unloading the substrate from the apparatus.

In one embodiment, in the forming of the He HDP oxide liner, a first bias power is applied and, in the forming of the $H_2$ HDP oxide film, a second bias power is applied at a power level that is greater than that of the first bias power.

In another embodiment, the first bias power is in a range of about 500 to 2000 W.

In another embodiment, the second bias power is in a range of about 3000 to 6000 W.

In another embodiment, in the primarily heating, the substrate is heated to a temperature in a range of about 300 to 400° C.

In another embodiment, in the forming of the He HDP oxide liner, the substrate is at a temperature in a range of about 300 to 450° C.

In another embodiment, a time required for forming the He HDP oxide liner is in a range of about 1/200 to 1/10 an amount of time required for forming the $H_2$ HDP oxide film.

In another embodiment, the forming of the He HDP oxide liner is performed for a time period ranging from about one to five seconds.

In another embodiment, in the secondarily heating, the substrate is heated to a temperature ranging from about 400 to 600° C.

In another embodiment, the secondarily heating is performed for a time period ranging from about 50 to 150 seconds.

In another embodiment, in the forming of the $H_2$ HDP oxide film, the temperature of the substrate is in a range of about 600 to 800° C.

In another embodiment, the forming of the $H_2$ HDP oxide film is performed for a time period ranging from about 50 to 200 seconds.

In another embodiment, an oxide film and a nitride liner are sequentially formed on the side wall and bottom surfaces of the trench.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE PREFERRED EMBODIMENTS

Figure 1:
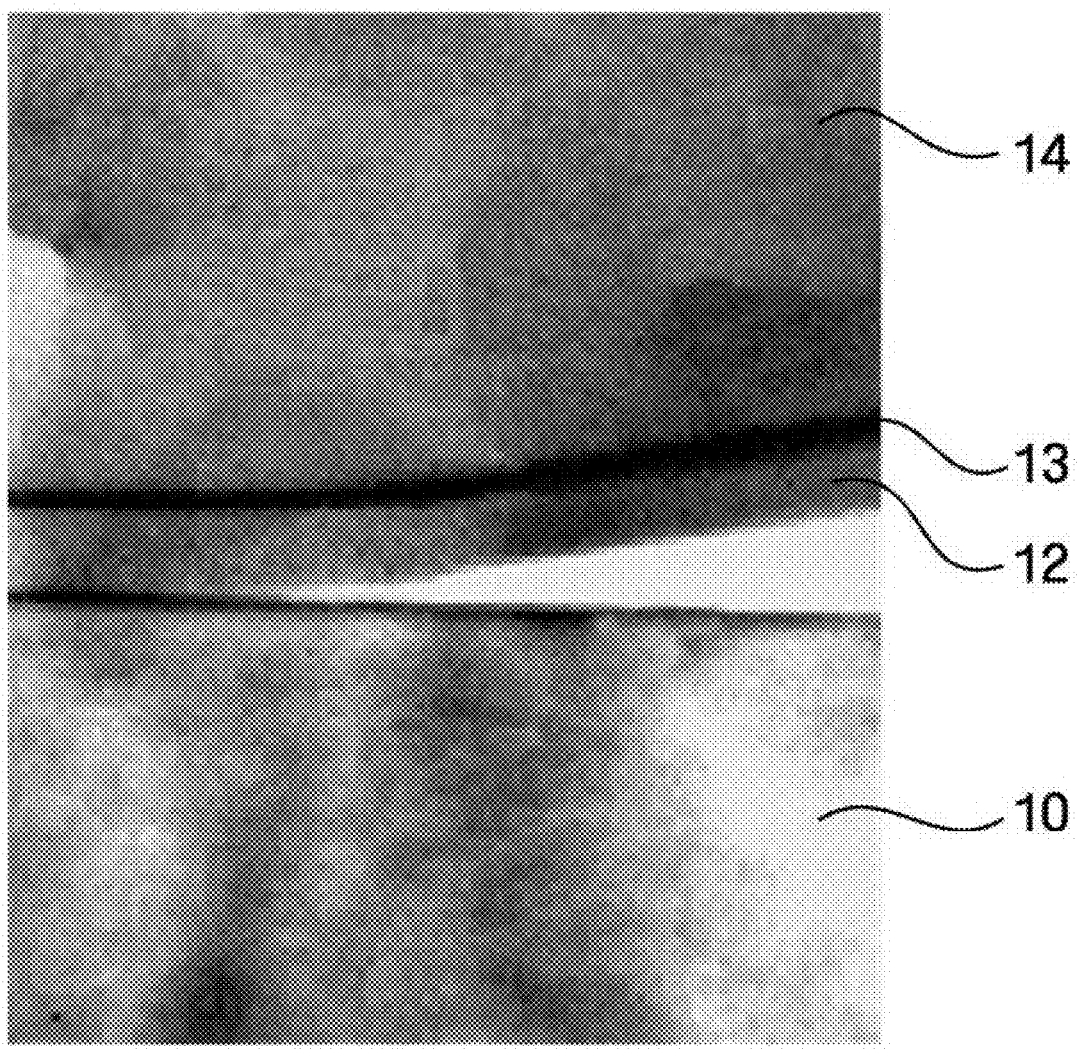
FIG. 1 is a TEM photograph of a section of an STI structure fabricated by a method according to the conventional art.
Figure 2:
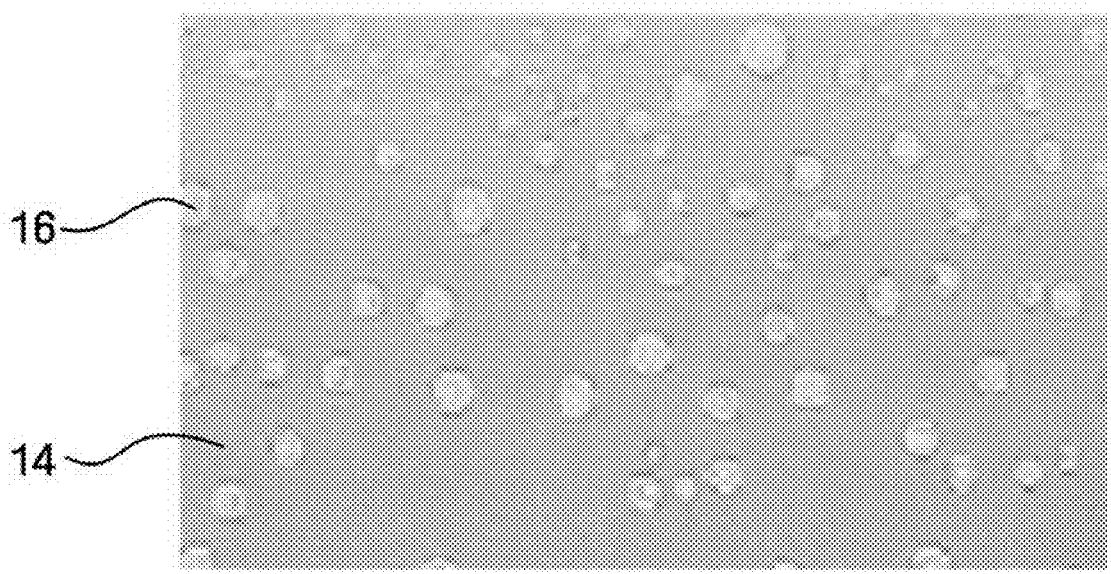
FIG. 2 is an SEM photograph of a top surface of the STI structure fabricated by the method according to the conventional art.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete. In some embodiments, the detailed descriptions of known process steps, element structures, and technologies will be omitted because they may obscure the subject matter of the present invention. Like reference numerals refer to like elements throughout the specification.

The terminology used therein is for the purpose for only describing particular embodiments and is not intended to limit the present invention. It will be understood that the terms 'comprises' and/or 'comprising' when used in the specification specify the presence of stated features, steps, operations, and/or elements, but do not preclude the presence or addition of one or more other features, steps, operations, and/or elements.

A method of fabricating a shallow trench isolation (hereinafter, simply referred to as 'STI') structure of a semiconductor device according to an embodiment of the present invention will now be described with reference to FIGS. 3 to 10. In the description of the fabricating method, the schematic descriptions of the process steps widely known to those skilled in the art will be given so as to clearly describe the subject matter of the embodiment of the present invention.

FIGS. 3 to 6 are cross-sectional views illustrating process steps up to a step of forming a liner the before gap filling process steps.

Figure 3:
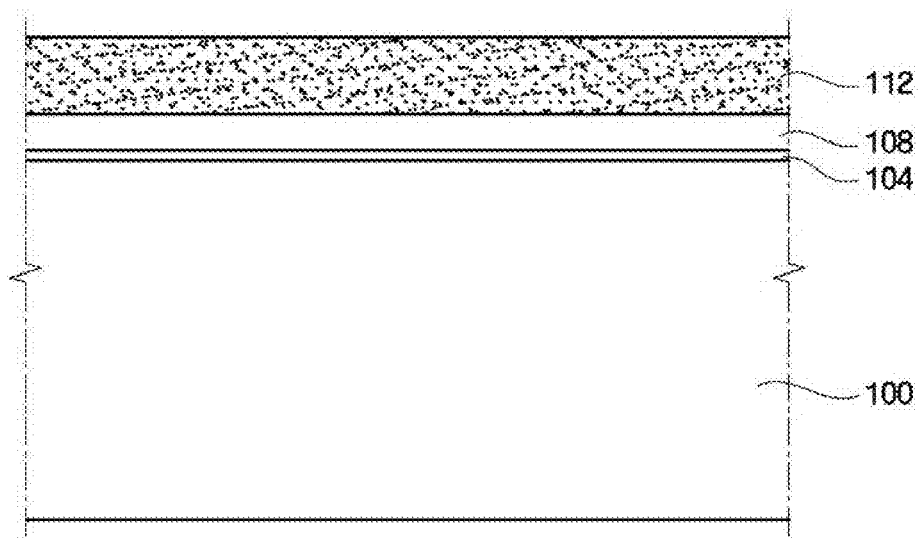
FIG. 3 is a cross-sectional view illustrating process steps up to a step of forming a liner in a method of fabricating an STI structure according to an embodiment of the present invention.

First, referring to FIG. 3, a pad oxide film 104 and a hard mask nitride film 108 are formed sequentially on an integrated circuit substrate 100, for example, a silicon substrate. Next, an organic anti-reflection coating (hereinafter, simply referred to as 'ARC') layer (not shown) and a photoresist layer 112 are coated on the nitride film 108. The pad oxide film 104 is formed to reduce stress between the substrate 100 and the nitride film 108. The pad oxide film 104 has a thickness of about 20 to 200 Å. The nitride film 108 is used as a hard mask at the time of etching for forming an STI region. The nitride film 108 is formed by depositing a silicon nitride film at a thickness of 500 to 2000 Å. As a deposition method, for example, CVD (Chemical Vapor Deposition), SACVD (Sub-Atmospheric DVD), LPCVD (Low Pressure CVD), or PECVD (Plasma Enhanced CVD) can be used.

Figure 4:
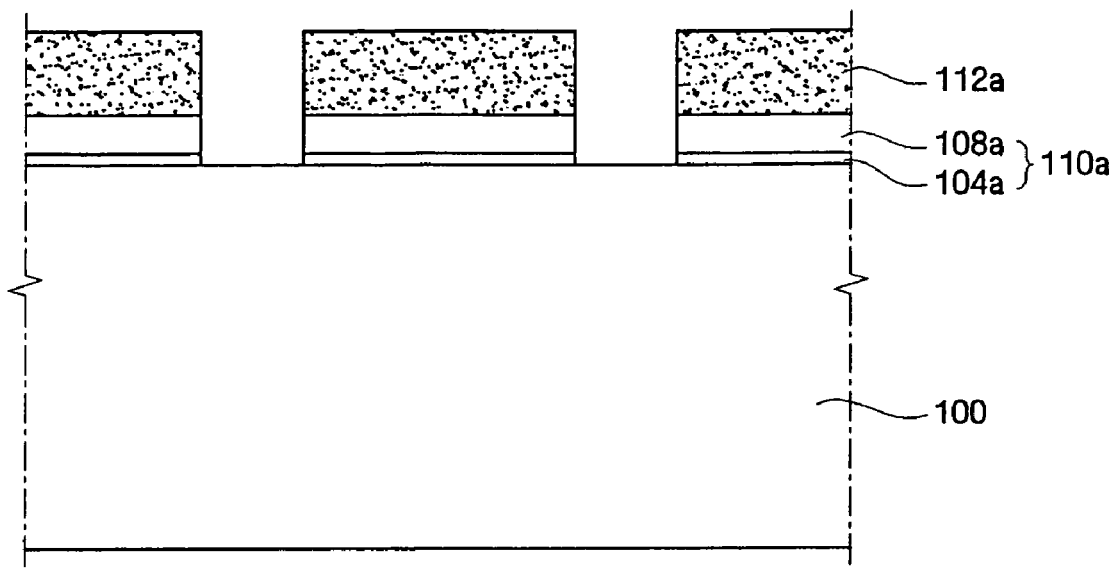
FIG. 4 is a cross-sectional view illustrating process steps up to a step of forming a liner in a method of fabricating an STI structure according to an embodiment of the present invention.

Referring to FIG. 4, a photoresist pattern 112a is formed to define an active region. Then, the nitride film 108 and the pad oxide film 104 are etched by a dry etching method with the photoresist pattern 112a as a mask, thereby forming a trench mask 110a having a nitride film pattern 108a and a pad oxide film pattern 104a. When etching the nitride film 108, a fluorocarbon gas is used. For example, a $C_xF_y$-based or $C_aH_bF_c$-based gas, such as $CF_4$, $CHF_3$, $C_2F_6$, $CH_2F_2$, $CH_3F$, $CH_4$, $C_2H_2$, or $C_4F_6$, or a mixed gas of these gases is used. At this time, an Ar gas is used as an atmospheric gas.

Figure 5:
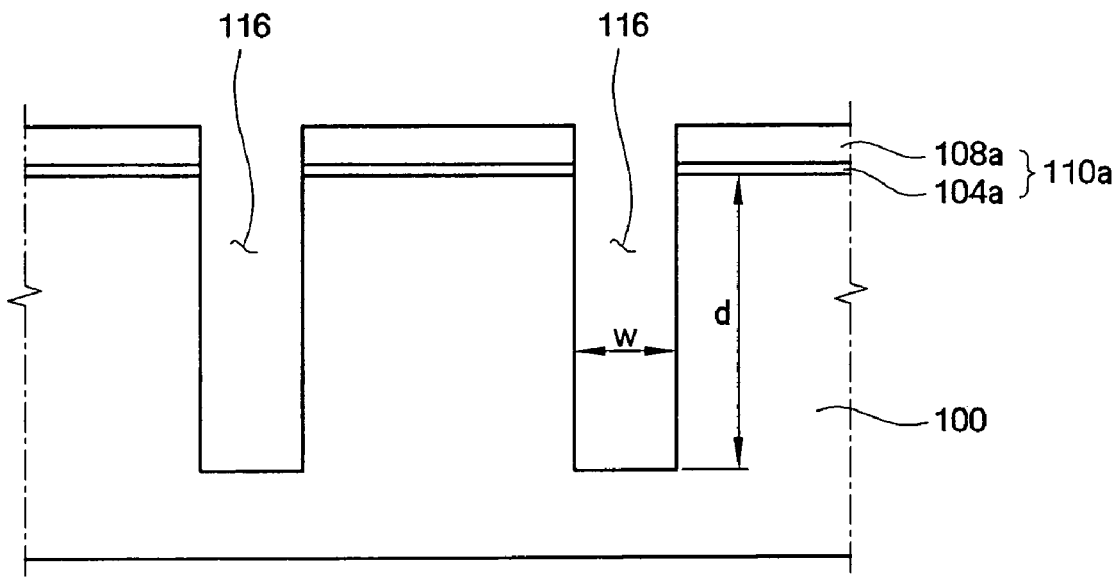
FIG. 5 is a cross-sectional view illustrating process steps up to a step of forming a liner in a method of fabricating an STI structure according to an embodiment of the present invention.

Referring to FIG. 5, after the photoresist pattern 112a is removed, the exposed substrate 100 is etched by an anisotropic etching method with the trench mask 110a as the etching mask, thereby forming trenches 116 of the STI structure for defining the device active regions therebetween. The photoresist pattern 112a can be removed by a typical method, for example, an organic strip after ashing is performed with oxygen plasma. For the purpose of high integration, the trench 116 of the STI can be formed to have a width of 0.2 μm or less. At this time, the trench 116 of the STI is formed to have enough depth so as to provide for sufficient device separation.

Figure 6:
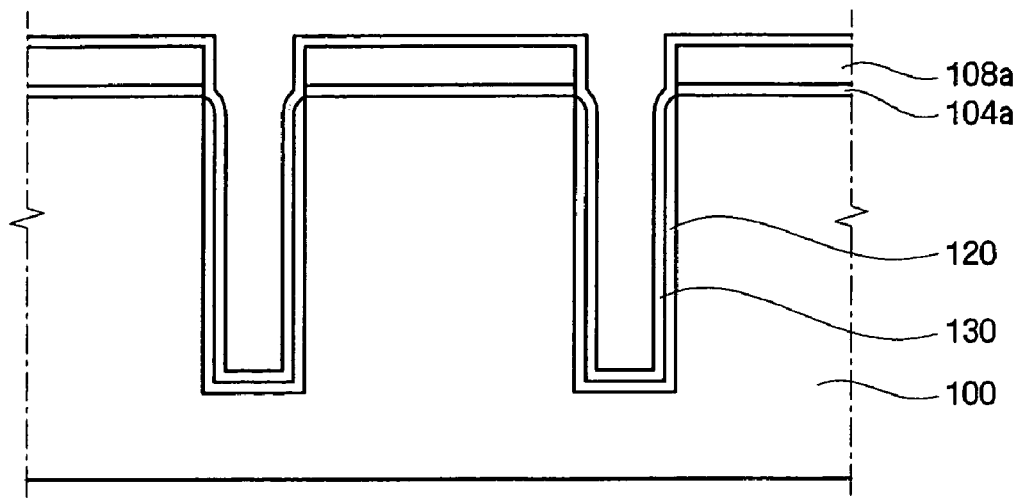
FIG. 6 is a cross-sectional view illustrating process steps up to a step of forming a liner in a method of fabricating an STI structure according to an embodiment of the present invention.

Referring to FIG. 6, an oxide film 120 is formed on the side walls and on the bottom portion of the trench 116 of the STI. The oxide film 120 is formed to recover silicon lattice defects and damage generated during the dry etching process for forming the trench 116 of the STI and to round corners of the trench 116 of the STI, thereby preventing stress from centering on the corners. The oxide film 120 can be formed, for example, of a thermally grown oxide film, a CVD oxide film, or an ALD (Atomic Layer Deposition) oxide film. The oxide film 120 can be formed to have a thickness of about 50 to 300 Å.

A nitride liner 130 is formed on the oxide film 120 along the side walls of the trench 116. The nitride liner 130 can be formed, for example, of a nitride film or an oxynitride film. The nitride liner 130 operates to absorb stress caused by a difference in thermal expansion coefficient between the substrate 100 and an HDP oxide film to be subsequently filled into the trench 116 of the STI structure, and to prevent defects generated in the active region from diffusing into the inner regions of the STI structure. Further, the nitride liner 130 operates to prevent the semiconductor substrate in contact with the STI from becoming oxidized due to the diffusion of oxygen into the inside of the semiconductor substrate of the active region through the STI during a subsequent heat treatment process or oxidization process. In addition, the nitride liner 130 is formed to prevent ions injected into the active region from being diffused in a direction toward the STI. The nitride liner 130 can be formed to have a thickness, for example, of about 50 to 300 Å.

In FIG. 6, a case where both the oxide film 120 and the nitride liner 130 are formed has been described. In some cases, however, only the oxide film 120 is formed.

Next, a gap filling process for filling the inside of the STI trench is performed. The gap filling process in accordance with an embodiment of the present invention can form the HDP oxide film for filling the gap by applying a high bias power, thereby ensuring an excellent gap filling property. Further, the process is performed in a manner that mitigates or prevents separation between the oxide film 120 and the liner 130 on the side wall, and further mitigates or prevents the generation of bubble defects in the HDP oxide film. In addition, an additional CVD process, required in some of the conventional approaches outlined above, is not necessary.

Figure 7:
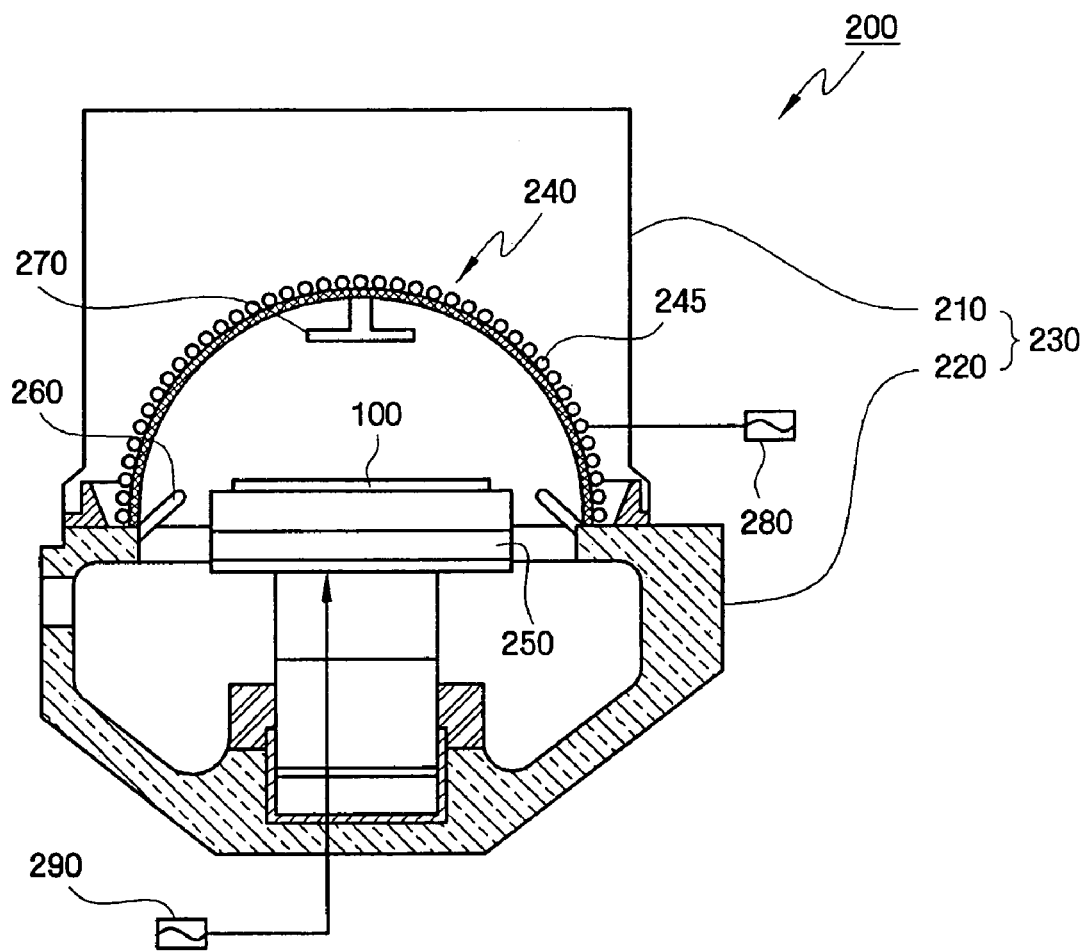
FIG. 7 is a schematic cross-sectional view of a high-density plasma chemical vapor deposition (HDP CVD) apparatus to be used for gap filling.
Figure 8:
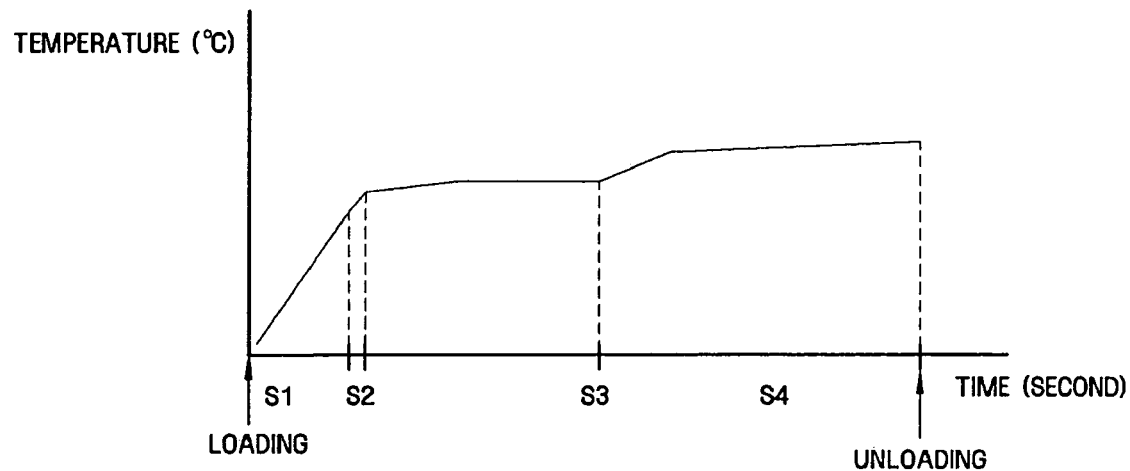
FIG. 8 is a schematic graph showing the relationship between time and temperature at individual steps of a gap filling process.
Figure 9:
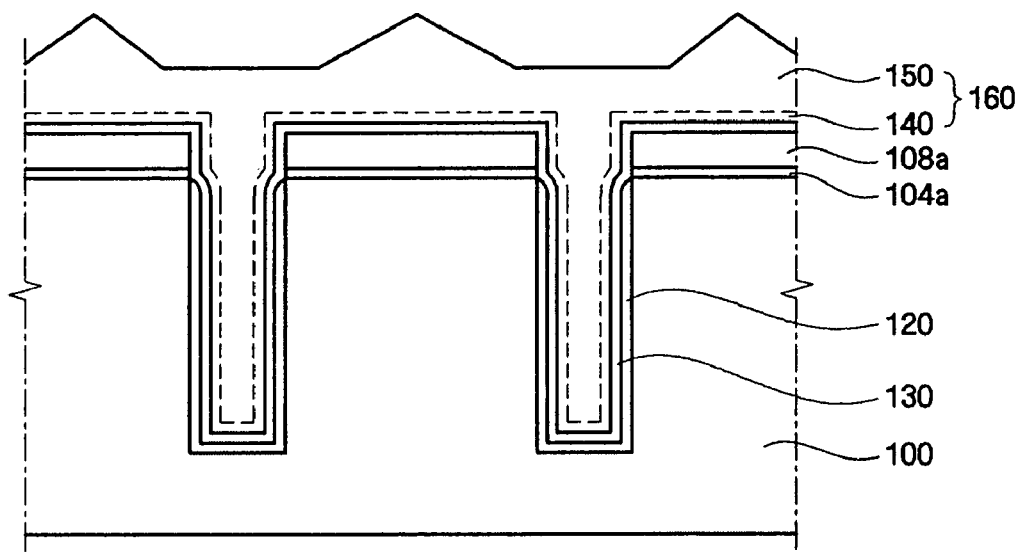
FIG. 9 is a cross-sectional view after gap filling is completed.

Specifically, the gap filling process in accordance with an embodiment of the invention is performed by using an HDP CVD apparatus, for example, of the type shown in FIG. 7, that depends on the relationship between time and temperature shown in FIG. 8. A gap filling oxide film is thereby formed in a section shape as shown in FIG. 9.

Referring to FIG. 7, the HDP CVD apparatus 200 includes a chamber 230 which has an upper chamber 210 and a lower chamber 220. The upper chamber 210 and the lower chamber 220 are engaged so as to form an enclosed space. The upper chamber 210 is formed in a dome shape, and has a dome-shaped upper electrode 240 on which a plurality of radio frequency (RF) coils 245 are provided. A low-frequency RF power is applied to the RF coils 245 from a first RF power generator 280. The lower chamber 220 has an electrostatic chuck 250 on which the semiconductor substrate 100 is placed. A high-frequency RF power serving as a bias power is applied to the electrostatic chuck 250 from a second RF power generator 290. Side gas ejectors 260 are provided inside the chamber at regular intervals along the circumference of the electrostatic chuck 250. In the upper chamber 210 in which multiple nozzles are formed, a rotatable upper gas ejector 270 is provided. Various modifications of the structures, shapes, and installment positions of the gas ejectors 260 and 270 can be used.

FIG. 8 is a graph schematically depicting the relationship between time and temperature at various steps of the gap filling process. Referring to FIG. 8, the gap filling process includes a primary heating step (S1), an HDP oxide liner forming step (S2), a secondary heating step (S3), and a gap filling HDP oxide film forming step (S4). At the heating steps (S1 and S3), the temperature of the substrate is increased by high-density plasma (HDP) generated when only the low-frequency RF power is applied to the HDP CVD apparatus shown in FIG. 7 and the applied RF power. During the heating steps, deposition is not performed. On the other hand, during the HDP oxide liner forming step (S2) and the HDP oxide film forming step (S4), the deposition is performed by applying the low-frequency RF power and the high-frequency bias RF power to the apparatus while supplying a deposition gas into the apparatus.

The individual steps will now be specifically described with reference to FIGS. 7 to 9.

First, after the substrate 100 on which the pad oxide film pattern 104a, the nitride film pattern 108a, the oxide film 120, and the nitride liner 130 are formed is loaded onto the electrostatic chuck 250 of the HDP CVD apparatus 200, the primary heating step (S1) is performed.

Specifically, an RF power of about 3000 to 6000 W is applied to an RF coil 245 from the first RF power generator 280 for about 20 to 50 seconds, while maintaining the pressure within the chamber 230 at a low pressure of about 5 to 50 mTorr by operating a vacuum pump (not shown) connected to an exhaust line (not shown). Then, an inert gas such as an Ar gas or a He gas is supplied through the gas injectors 260 and 270. As a result, the HDP is generated in the chamber 230, and the temperature of the substrate 100 may be increased to about 300 to 400° C. so as to be at a first temperature by the generated HDP and the applied RF power. If necessary, an $O_2$ gas may be further supplied in order to eliminate impurities at the inlets of the gas injectors 260 and 270.

Next, the HDP oxide liner forming step (S2) is performed.

Specifically, an RF power of about 3000 to 9000 W is applied to the RF coil 245 from the first RF power generator 280 and a bias RF power of about 500 to 2000 W is applied to the electrostatic chuck 250 from the second RF power generator 290 for a short time of 1 to 5 seconds, while maintaining the pressure at the same level within the chamber. Further, the deposition gas (silicon source gas and oxidized gas) and sputtering gas are supplied through the gas injectors 260 and 270. A $SiH_4$ gas, an $O_2$ gas, and a He gas can be used as the silicon source gas, the oxidized gas, and the sputtering gas, respectively. Some of the supplied deposition gas and sputtering gas is ionized by the HDP generated in the chamber 230. On the other hand, the deposition gas and sputtering gas which are ionized by the bias RF power applied to the electrostatic chuck 250 are accelerated to the surface of the substrate. The accelerated ions of the deposition gas form a silicon oxide film, and then sputtering is performed on the deposited silicon oxide film by the accelerated ions of the He gas. As a result, a thin-film HDP oxide liner (see reference numeral 140 of FIG. 9) can be formed on the nitride liner 130.

The HDP oxide liner 140 is formed by applying a first bias power of about 500 to 2000 W which is lower than a second bias power of about 3000 to 6000 W to be applied at the HDP oxide film forming step (S4) for gap filling. Therefore, the amount of defects and the defect size due to collision of the accelerated ions can be reduced.

Further, since the bias power is low, there occurrence of the lower oxide film 120 and the nitride liner 130 separating from the substrate 100 is mitigated or eliminated.

The HDP oxide liner 140 can be formed of a $H_2$ or a He HDP oxide liner.

On the other hand, because the HDP oxide liner 140 is formed by applying a relatively low bias power and a relatively low RF power, a sufficient gap filling property is not exhibited. Accordingly, the HDP oxide liner forming step (S2) is performed in the required amount of time so as to ensure an adequate thickness to accomplish its functioning as a film, for example, 1 to 5 seconds which corresponds to about $1/200$ to $1/10$ amount of time of the time needed for the HDP oxide film forming step (S4) for substantial gap filling.

The temperature of the substrate can be substantially equal to the first temperature or increased to a second temperature which is slightly higher than the first temperature, for example, 300 to 450° C., by the applied RF power and bias RF power.

Next, the secondary heating step (S3) is performed.

Specifically, an RF power of about 3000 to 7000 W is applied to the RF coil 235 from the first RF power generator 280 for about 50 to 150 seconds while maintaining pressure at the same level within the chamber 230. At the time of the start of the secondary heating step (S3), the bias RF power applied to the electrostatic chuck 250 is turned off, and the supply of the deposition gas (silicon source gas and oxidized gas) through the gas injectors 260 and 270 stops. Then, an inert gas such as an Ar gas or a He gas is supplied through the gas injectors 260 and 270. Like the primary heating step (S1), if necessary, an $O_2$ gas may be further supplied.

The temperature of the substrate 100 can be therefore increased to a third temperature of about 400 to 600° C. by the HDP previously generated within the chamber 230, the newly generated HDP, and the applied RF power.

Since the bias RF power is turned off, during the secondary heating step (S3), the actual deposition of the HDP oxide film is not performed. Further, the ions which are undesirably trapped by the HDP oxide liner 140 are outgassed, and thus the defects of the oxide film 120, the nitride liner 130, and the HDP oxide liner 140 can be effectively cured.

In order to the reduce the defects, preferably the temperature at the secondary heating step (S3), that is, the third temperature, is higher than the second temperature, but is closer to a temperature of the subsequent HDP oxide film forming step (S4).

Next, the HDP oxide film deposition step (S4) for substantial gap filling is performed.

Specifically, an RF power of about 3000 to 9000 W is applied to the RF coil 235 from the first RF power generator 280 and a second bias RF power of about 3000 to 6000 W is applied to the electrostatic chuck 250 from the second RF power generator 290 for a time period of 50 to 200 seconds, while maintaining the pressure at the same level within the chamber 230 as the above-described steps (S1, S2, and S3) or at a lower level, for example, 5 to 20 mTorr. Then, the deposition gas (silicon source gas and oxidized gas) and the sputtering gas are supplied through the gas injectors 260 and 270. An $SiH_4$ gas, an $O_2$ gas, and a $H_2$ gas can be used as the silicon source gas, the oxidized gas, and the sputtering gas, respectively. When the HDP oxide film deposition step (S4) is performed under this process condition, the temperature of the substrate 100 can be increased to about 600 to 800° C.

The $H_2$ gas allows the HDP oxide film having an excellent gap filling property to be formed, but requires a relatively high bias power. Further, the He gas requires a low bias power, but an inferior gap filling property is obtained, as compared with the $H_2$ gas. Therefore, the formation of the liner and the gap filling property can be optimized by forming the HDP oxide liner 140 and the HDP oxide film 150 with the He HDP oxide liner and the $H_2$ HDP oxide film, respectively.

Like the HDP oxide liner 140 forming step (S2), some of the deposition gas and sputtering gas is ionized by the HDP generated within the chamber 230, and the deposition gas and sputtering gas which are ionized by the bias RF power applied to the electrostatic chuck 250 are accelerated to the surface of the substrate. The accelerated ions of the deposition gas form a silicon oxide film, and sputtering is performed on the deposited silicon oxide film by the accelerated ions of the $H_2$ gas. Since the deposition is performed in such a manner, as shown in FIG. 9, the HDP oxide film 150 which fills the gap on the HDP oxide liner 140 is formed. The HDP oxide film 150 has a dense film quality and an excellent gap filling property. Further, the profile of the top surface of the HDP oxide film 150 is generally as shown in FIG. 9.

In FIG. 9, the boundary of the HDP oxide liner 140 and the HDP oxide film 150 is indicated by a dotted line. This is because the liner 140 and the oxide film 150 are substantially formed of the same material, and thus the boundary between them cannot be readily visually recognized.

Since the HDP oxide liner 140 has been already formed, even though a high bias power is applied when later forming the HDP oxide film 150, the oxide film 120 and the nitride liner 130 do not become separated from the substrate 100. Therefore, during the HDP oxide film 150 forming step (S4), a high bias power of about 3000 to 6000 W can be applied. For this reason, the HDP oxide film 150 can be formed for completely filling the STI trench 116 without the presence of voids in the resulting film.

In addition, the HDP oxide liner 140 is formed by applying a low bias power and then any defects occurring thereon are cured through the heating steps. The HDP oxide film 150 is formed with the presence of the HDP oxide liner 140 operating as a buffer layer. For this reason, bubble defects do not occur in the resulting HDP oxide film 150.

After a gap filling film 160 including the HDP oxide liner 140 and the HDP oxide film 150 is formed, the substrate 100 is unloaded from the HDP CVD apparatus 200, and then the gap filling process is completed.

Figure 10:
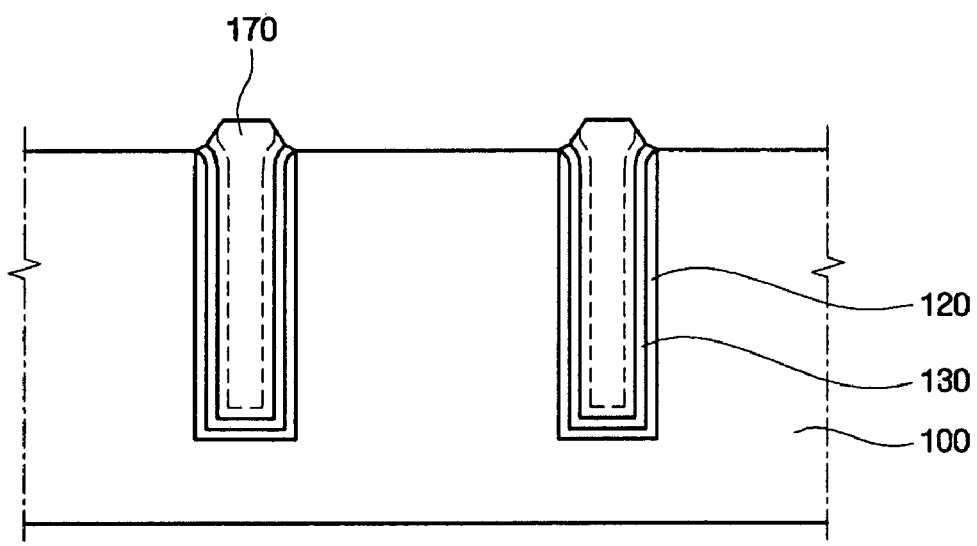
FIG. 10 is a cross-sectional view showing a process of finishing the STI structure after gap filling is completed.

Finally, as shown in FIG. 10, formation of the STI structure 170 is completed. With reference to FIG. 10, first, the gap filling film 160 is planarized at the substantially same level as the top surface of the trench mask 110a. The planarization can be performed, for example, using a CMP (Chemical Mechanical Polishing) process or etchback process. In the planarization process, the nitride pattern 108a can be used as planarization stopper. For example, when planarizing the HDP oxide film 150 using the CMP process, the nitride pattern 108a serves as a CMP stopper. As a slurry to be used in the CMP process, a material which can selectively etch the HDP oxide film 150 faster than the nitride film pattern 108a is preferably selected. Therefore, a slurry including a ceria-based abrasive can be used.

Next, the trench mask 110a (see FIG. 4) is removed, and then the STI structure 170 is completed. The nitride film pattern 108a of the trench mask 110a is removed by applying phosphoric acid, and the pad oxide film pattern 104a is removed by applying diluted HF or BOE (Buffered Oxide Etchant) which is a mixture of $NH_4F$, HF, and deionized water.

Subsequently, a step of forming active elements such as transistors and passive elements such as capacitors in the active region defined by the STI structures 170, a step of forming wiring lines to allow input/output of electrical signals to/from the active elements and the passive elements, a step of forming a passivation layer on the substrate, and a step of packaging the substrate are further performed using conventional fabricating processes, thereby completing fabrication of a semiconductor device including the STI structures formed according to the methods described herein. The schematic descriptions of the subsequent steps will be given because they may obscure the subject matter of the present invention.

The results of the fabrication of STI structures under the method of the present invention will now be described by way of the following specific examples.

Three test substrates on which the thermally grown oxide film having a thickness of 100 Å and the nitride film having a thickness of 70 Å are formed on the semiconductor substrate are prepared. Then, the HDP oxide films are formed under the process conditions shown in Table 1, respectively.

TABLE 1

|  | Primary heating | HDP oxide liner | Secondary heating (time/temperature) | HDP oxide film |
|---|---|---|---|---|
| First Example | ○ | ○ | ○ (60 to 80 seconds/400 to 450° C.) | ○ |
| Second Example | ○ | ○ | ○ (80 to 120 seconds/450 to 550° C.) | ○ |
| Comparative Example | ○ | ○ | x | ○ |

In Table 1, the primary heating step is performed by applying an RF power such that the temperature of the substrate becomes about 350° C., while supplying Ar and He gas. The HDP oxide liner forming step is performed by applying a bias power of 1500 W and an RF power such that the temperature of the substrate becomes about 400° C. while supplying the $SiH_4$ gas, the $O_2$ gas, and the He gas. The HDP oxide film forming step is performed by applying a bias power of 4900 W and an RF power such that the temperature of the substrate becomes about 700° C. while supplying the $SiH_4$ gas, the $O_2$ gas, and the $H_2$ gas.

Figure 11A:
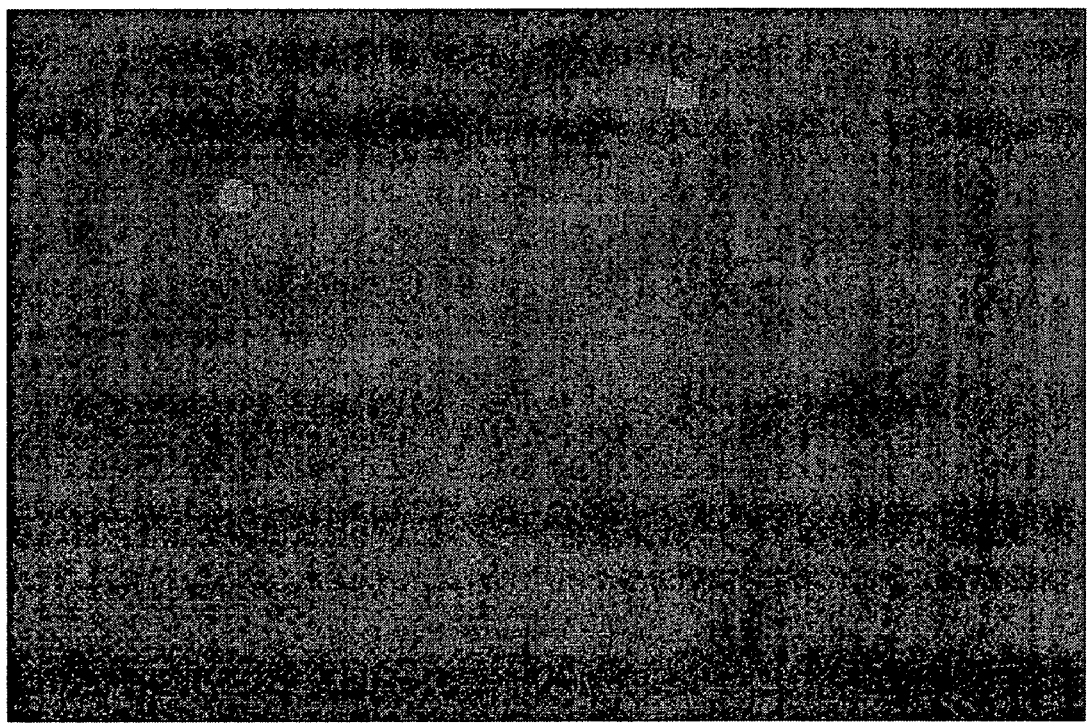
FIG. 11A is an SEM photograph showing a surface state of an HDP oxide film fabricated according to each example of the present invention.
Figure 11B:
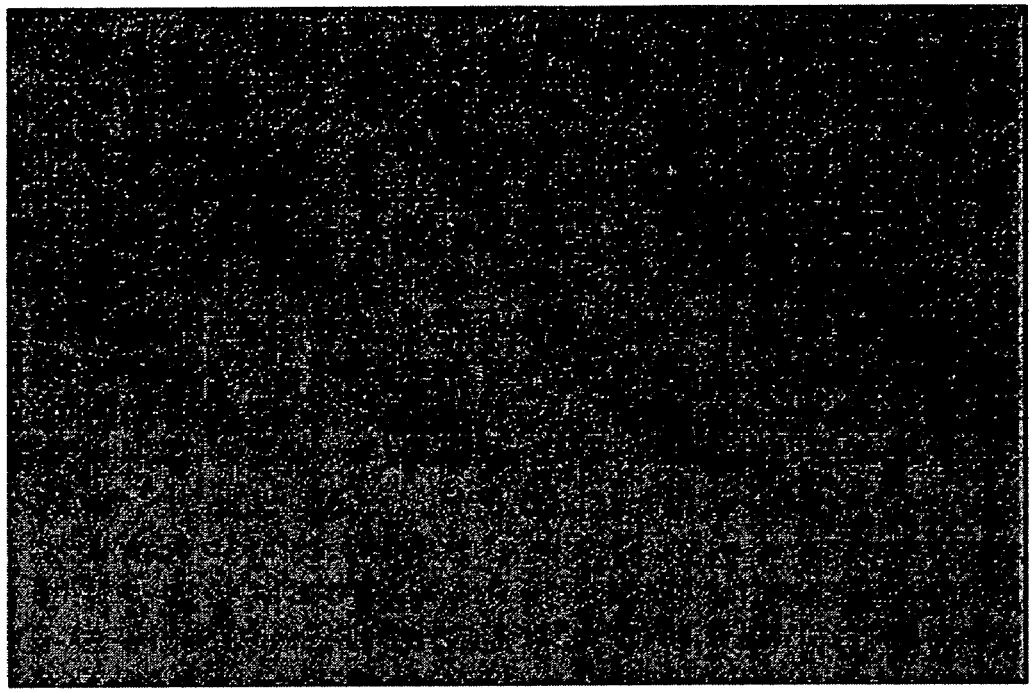
FIG. 11B is an SEM photograph showing a surface state of an HDP oxide film fabricated according to each example of the present invention.
Figure 11C:
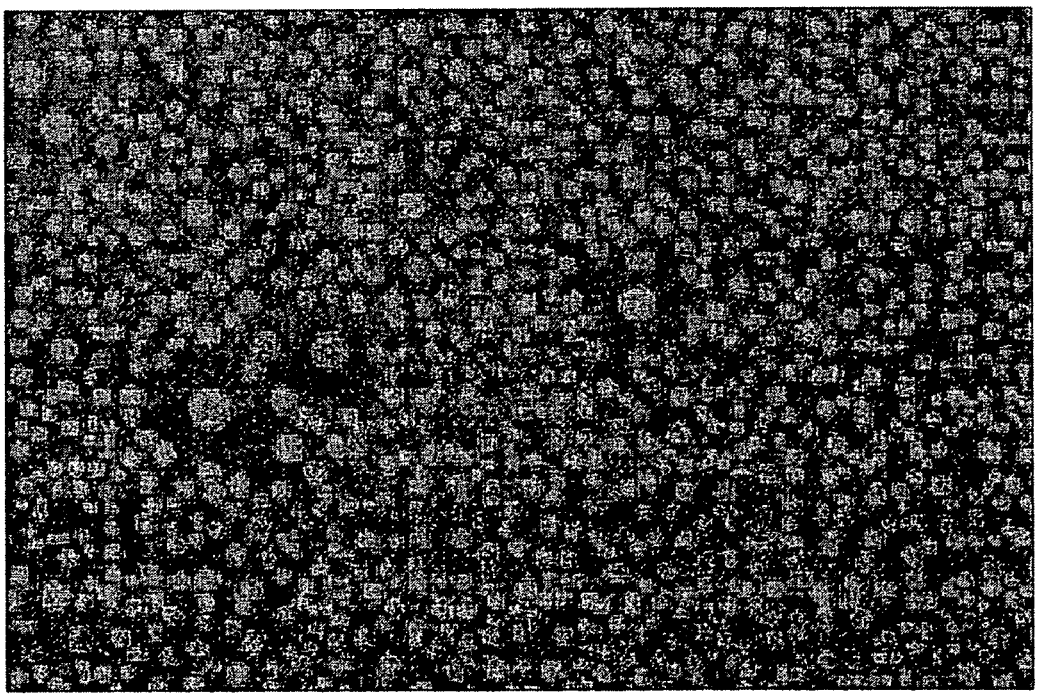
FIG. 11C is an SEM photograph showing a surface state of an HDP oxide film fabricated according to a comparative example.

FIGS. 11A and 11B are SEM photographs of the surfaces of the HDP oxide films fabricated according to the first and second examples. FIG. 11C is a SEM photograph of the surface of the HDP oxide film fabricated according to the comparative example, where no secondary heating step is applied to the substrate.

From the photograph of FIG. 11C showing multiple bubble defects, it can be understood that the bubble defects can be effectively suppressed by performing the HDP oxide liner forming step and the secondary heating step. From the photographs of FIGS. 11A and 11B, it can be understood that the bubble defects can be effectively suppressed as the time duration of the secondary heating step is increased.

According to the present invention, the HDP oxide film for gap filling is formed by applying a high bias power, and thus an excellent gap filling property can be ensured, while preventing separation of the oxide film and the liner of the side wall and preventing the occurrence of bubble defects. In addition, the STI can be finished by a simplified process without requiring a CVD process, other than the HDP oxide film forming step.

Although the present invention has been described in connection with the exemplary embodiments of the present invention, it will be apparent to those skilled in the art that various modifications and changes may be made thereto without departing from the scope and spirit of the invention. Therefore, it should be understood that the above embodiments are not limited, but rather are illustrative in all aspects.

What is claimed is:

1. A method of fabricating a trench isolation structure of a semiconductor device, comprising:
   providing a substrate with a trench formed therein;
   forming an oxide film on side wall and bottom surfaces of the trench;
   forming a nitride liner on the oxide film on the side wall and bottom surfaces of the trench, and on top surfaces of the substrate;
   loading the substrate into a high-density plasma (HDP) chemical vapor deposition apparatus;
   primarily heating the substrate;
   applying a first bias power to the apparatus so as to form an HDP oxide liner on an entire surface of the nitride liner, a gap remaining in the trench following formation of the HDP oxide liner;
   removing the application of the first bias power and secondarily heating the substrate;
   applying a second bias power at a power level that is greater than that of the first bias power to the substrate so as to form an HDP oxide film to fill the gap in the trench; and
   unloading the substrate from the apparatus.

2. The method of claim 1, wherein, in the primarily heating, the substrate is heated to a temperature in a range of about 300 to 400° C.

3. The method of claim 1, wherein, in the forming of the HDP oxide liner, the substrate is heated to a temperature in a range of about 300 to 450° C.

4. The method of claim 1, wherein the first bias power is in a range of about 500 to 2000 W.

5. The method of claim 1, wherein the forming of the HDP oxide liner is performed within a time period which corresponds to a range of about 1/200 to 1/10 amount of a time period for forming of the HDP oxide film.

6. The method of claim 1, wherein the forming of the HDP oxide liner is performed for a time period ranging from about one to five seconds.

7. The method of claim 1, wherein, in the forming of the HDP oxide liner, a He gas is used as a sputtering gas.

8. The method of claim 1, wherein, in the secondarily heating, the substrate is heated to temperature in a range of about 400 to 600° C.

9. The method of claim 1, wherein the secondarily heating is performed for a time period ranging from about 50 to 150 seconds.

10. The method of claim 1, wherein, in the forming of the HDP oxide film, the substrate is at a temperature ranging from about 600 to 800° C.

11. The method of claim 1, wherein the second bias power is in a range of about 3000 to 6000 W.

12. The method of claim 1, wherein the forming of the HDP oxide film is performed for time period ranging from about 50 to 200 seconds.

13. The method of claim 1, wherein, in the forming of the HDP oxide film, a $H_2$ gas is used as a sputtering gas.

14. The method of claim 1, wherein an oxide film and a nitride liner are sequentially formed on the side wall and bottom surfaces of the trench.

15. The method of claim 1, wherein the substrate comprises:
   a semiconductor base substrate;
   a pad oxide layer on the semiconductor base substrate; and
   a nitride layer on the pad oxide layer.

16. A method of fabricating a trench isolation structure of a semiconductor device, comprising:
   providing a substrate with a trench formed therein;
   forming an oxide film on side wall and bottom surfaces of the trench;
   forming a nitride liner on the oxide film on side wall and bottom surfaces of the trench, and on top surfaces of the substrate;
   loading the substrate into a high-density plasma (HDP) chemical vapor deposition apparatus;
   primarily heating the substrate;
   forming a He HDP oxide liner on an entire surface of the nitride liner, a gap remaining in the trench following forming the He HDP oxide liner;
   secondarily heating the substrate;
   forming a $H_2$ HDP oxide film to fill the gap in the trench; and
   unloading the substrate from the apparatus.

17. The method of claim 16, wherein, in the forming of the He HDP oxide liner, a first bias power is applied and, in the forming of the $H_2$ HDP oxide film, a second bias power is applied at a power level that is greater than that of the first bias power.

18. The method of claim 17, wherein the first bias power is in a range of about 500 to 2000 W.

19. The method of claim 17, wherein the second bias power is in a range of about 3000 to 6000 W.

20. The method of claim 16, wherein, in the primarily heating, the substrate is heated to a temperature in a range of about 300 to 400° C.

21. The method of claim 16, wherein, in the forming of the He HDP oxide liner, the substrate is at a temperature in a range of about 300 to 450° C.

22. The method of claim 16, wherein a time required for forming the He HDP oxide liner is in a range of about $\frac{1}{200}$ to $\frac{1}{10}$ an amount of time required for forming the $H_2$ HDP oxide film.

23. The method of claim 16, wherein the forming of the He HDP oxide liner is performed for a time period ranging from about one to five seconds.

24. The method of claim 16, wherein, in the secondarily heating, the substrate is heated to a temperature ranging from about 400 to 600° C.

25. The method of claim 16, wherein the secondarily heating is performed for a time period ranging from about 50 to 150 seconds.

26. The method of claim 16, wherein, in the forming of the $H_2$ HDP oxide film, the temperature of the substrate is in a range of about 600 to 800° C.

27. The method of claim 16, wherein the forming of the $H_2$ HDP oxide film is performed for a time period ranging from about 50 to 200 seconds.

28. The method of claim 16, wherein an oxide film and a nitride liner are sequentially formed on the side wall and bottom surfaces of the trench.

29. The method of claim 16, wherein the substrate comprises:
   a semiconductor base substrate;
   a pad oxide layer on the semiconductor base substrate; and
   a nitride layer on the pad oxide layer.

\* \* \* \* \*

UNITED STATES PATENT AND TRADEMARK OFFICE
CERTIFICATE OF CORRECTION

PATENT NO. : 7,608,519 B2  Page 1 of 1
APPLICATION NO. : 11/498667
DATED : October 27, 2009
INVENTOR(S) : Shin et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 617 days.

Signed and Sealed this

Twelfth Day of October, 2010

David J. Kappos
*Director of the United States Patent and Trademark Office*